United States Patent

Lai et al.

[11] Patent Number: 5,947,778
[45] Date of Patent: Sep. 7, 1999

[54] SOCKET CONNECTOR FOR A CHIP

[75] Inventors: Ching-ho Lai, Tao-Yuan Hsien; Warren Pei, Taipei, both of Taiwan

[73] Assignee: Hon Hai Precision Ind. Co., Ltd., Taipei Hsien, Taiwan

[21] Appl. No.: 08/904,217

[22] Filed: Jul. 31, 1997

[30] Foreign Application Priority Data

Oct. 3, 1996 [TW] Taiwan ................................. 85215365

[51] Int. Cl.⁶ ....................................................... H01R 4/02
[52] U.S. Cl. ............................................. 439/876; 439/342
[58] Field of Search ............................... 439/876, 72, 73, 439/83, 66, 329, 331, 342

[56] References Cited

U.S. PATENT DOCUMENTS

| | | | |
|---|---|---|---|
| 3,989,331 | 11/1976 | Hanlon | 439/70 |
| 5,420,377 | 5/1995 | Bresin et al. | 439/83 X |
| 5,735,698 | 4/1998 | Bakker et al. | 439/73 X |

FOREIGN PATENT DOCUMENTS

| | | | |
|---|---|---|---|
| 0 316 699 A1 | 11/1988 | European Pat. Off. | G06K 7/06 |
| 0 542 231 A2 | 11/1992 | European Pat. Off. | G06K 7/06 |
| 0 660 253 A1 | 12/1994 | European Pat. Off. | G06K 7/06 |
| 0 669 590 A2 | 2/1995 | European Pat. Off. | G06K 7/06 |
| 2 578 073 | 2/1985 | France | G06K 7/015 |

*Primary Examiner*—Khiem Nguyen

[57] ABSTRACT

A socket connector for a chip is disclosed. The socket connector for a chip comprises an insulating housing defining a mating surface and a soldering surface, including a plurality of through cavities communicating the mating surface and the soldering surface; a plurality of conductive contacts received in the through cavities, including a soldering section, a fixing section and a contacting section; and anti-wicking means including at least one attaching portion for attaching to the housing and a shielding portion for sealing up the bottom of the cavities to prevent entrance of contaminants therefrom.

8 Claims, 6 Drawing Sheets

SOCKET CONNECTOR FOR A CHIP

BACKGROUND OF THE INVENTION

1. Field of The Invention

The invention relates to the socket type connector receiving the pin type component therein, and particularly to a Zero Insertion Force Pin Grid Array (ZIF PGA) socket.

2. The Prior Art

ZIF PGA sockets have been more and more popular in the computer field recently for their convenience and for the low inventory cost of pin type components resulted in thereby. Since contacts for ZIF PGA sockets are usually mounted into holes thereof from the bottom for performance reasons, relatively large holes are formed on the housing of ZIF PGA sockets for the passing of a contacting section and an enlarged fixing section of the contacts. Contacts for ZIF PGA sockets can be found in, for example, Taiwan Patent Application Nos. 81214806A01, 82208934 and 82208933. These ZIF PGA sockets, however, involve the problem of wicking or splashing of molten solder and/or flux into the housing to contaminate the contacts during wave soldering. Such a conventional ZIF PGA socket, generally designated at 1, can be seen in FIGS. 1A to 1C. The ZIF PGA socket 1 comprises an insulating housing 10 having a plurality of cavities 101 (only a few shown in FIG. 1A) extending therethrough in a vertical direction for receiving a corresponding number of contacts 2 therein. Each cavity 101 comprises a through opening 1011 for facilitating insertion of the contact 2 therethrough and a vertical through recess 1010 for mounting the contact 2. In this arrangement, molten solders will be wicked or splashed into the vertical through recess 1010 in wave soldering procedure, and remain on the surfaces of the contacts, as can be seen in FIG. 1C, which may hinder the insertion of a lead pin of a mating electrical component or cause poor transmission of electrical signals. In addition, the waste liquids generated from washing the wave-soldered printed circuit board will leak from the bottom of the cavities 101 into the housing 10 and remain therein, which causes oxidation of surfaces of the contacts 2 and decreases the transmission ability thereof.

Hence, there is a need for an anti-wicking arrangement for a ZIF PGA socket that can solve the above-mentioned problems.

SUMMARY OF THE INVENTION

Accordingly, one main object of the present invention is to provide a socket connector having means for prevention of wicking and splashing during wave soldering procedure.

To fulfill the above-mentioned objects, according to one embodiment of the present invention, a socket connector for a chip comprises an insulating housing defining a mating surface and a soldering surface, including a plurality of through cavities communicating the mating surface and the soldering surface; a plurality of conductive contacts received in the through cavities, including a soldering section for soldering onto a surface of a printed circuit board, a fixing section for fixing to the insulating housing, and a contacting section for contacting a pin of the chip; and anti-wicking means including at least one attaching portion for attaching to the housing and a shielding portion for sealing up the bottom of the cavities to prevent entrance of contaminants therefrom.

In one preferred embodiment, the shielding portion of the anti-wicking means includes a layer of adhesive and the at least one attaching portion includes a film of anti-thermal material coated on one side of the adhesive layer.

In another preferred embodiment, the shielding portion of the anti-wicking means includes a shielding plate and the at least one attaching portion includes a pair of locking recesses formed on a pair of upward bending portions of the shielding plate and a pair of lateral protrusions of the housing latching into the locking recesses.

These and additional objects, features, and advantages of the present invention will be apparent from a reading of the following detailed description of the embodiments of the invention taken in conjunction with the appended drawing figures, which are described briefly immediately below.

DETAILED DESCRIPTION OF THE PREFERRED EMBODIMENTS

Figure 1A:
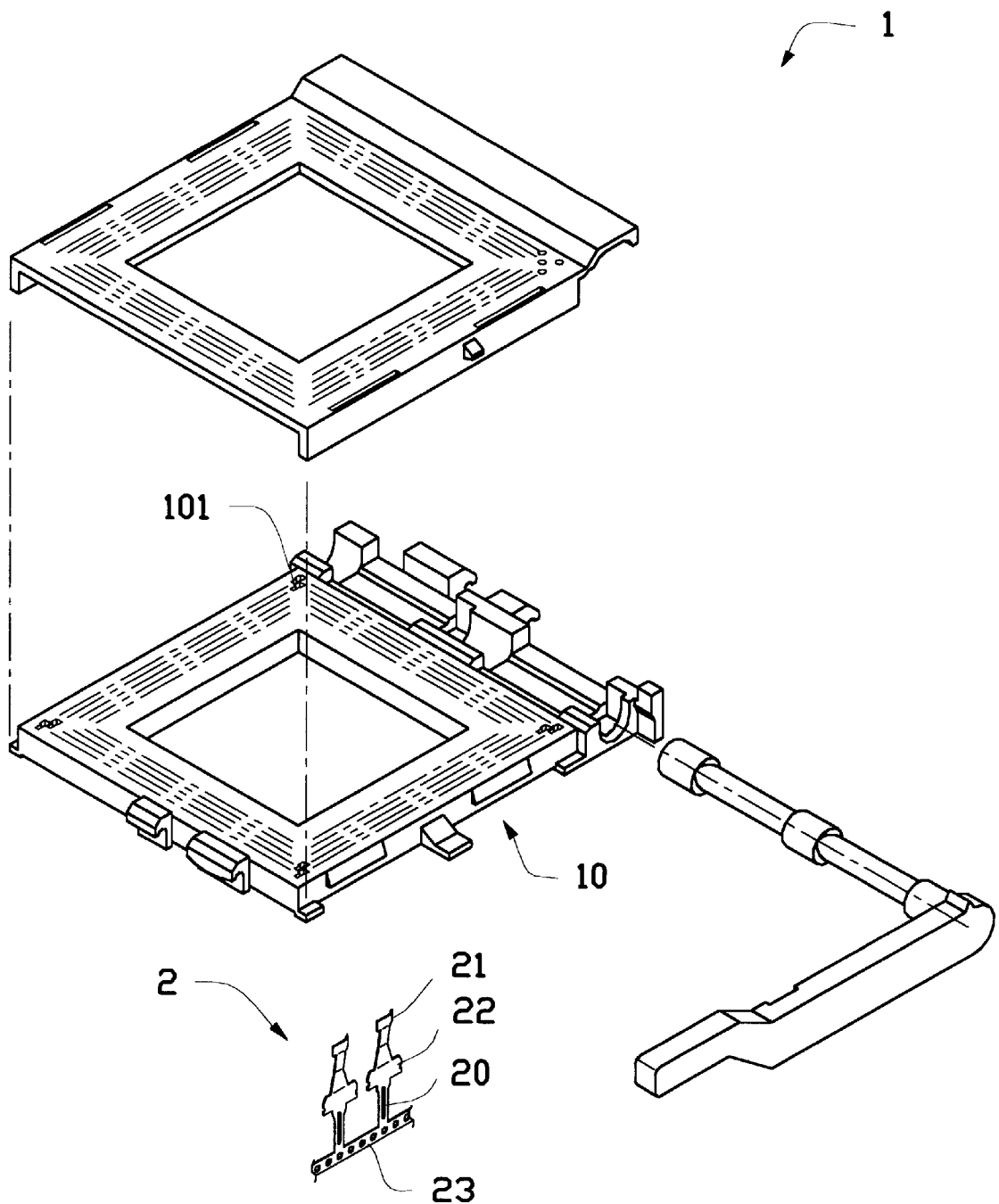
FIG. 1A is an exploded perspective view of a conventional ZIF PGA socket.
Figure 1B:
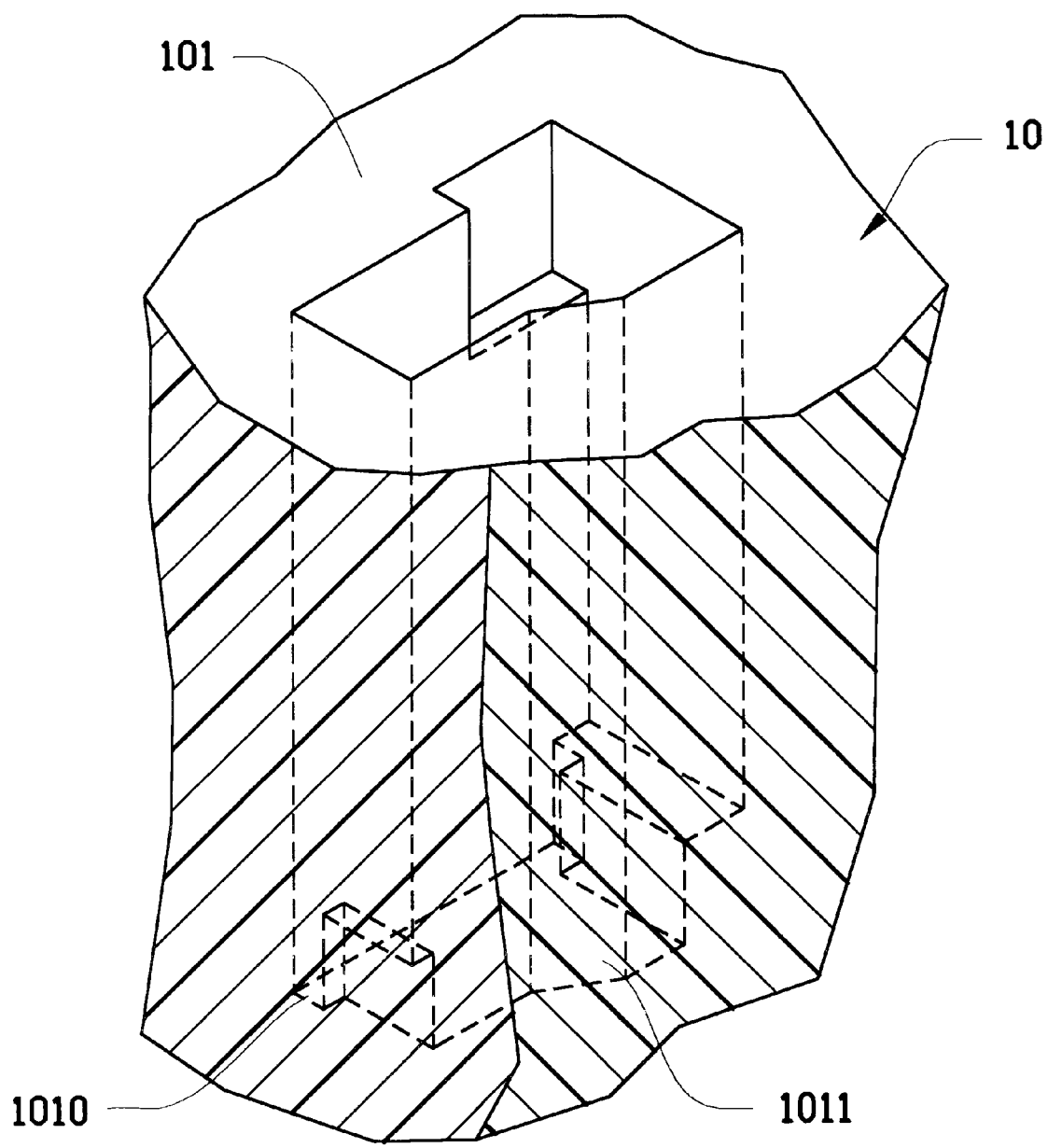
FIG. 1B is a partially cut-away perspective view of a cavity of the ZIF PGA socket shown in FIG. 1A for receiving a mating pin of a chip.
Figure 1C:
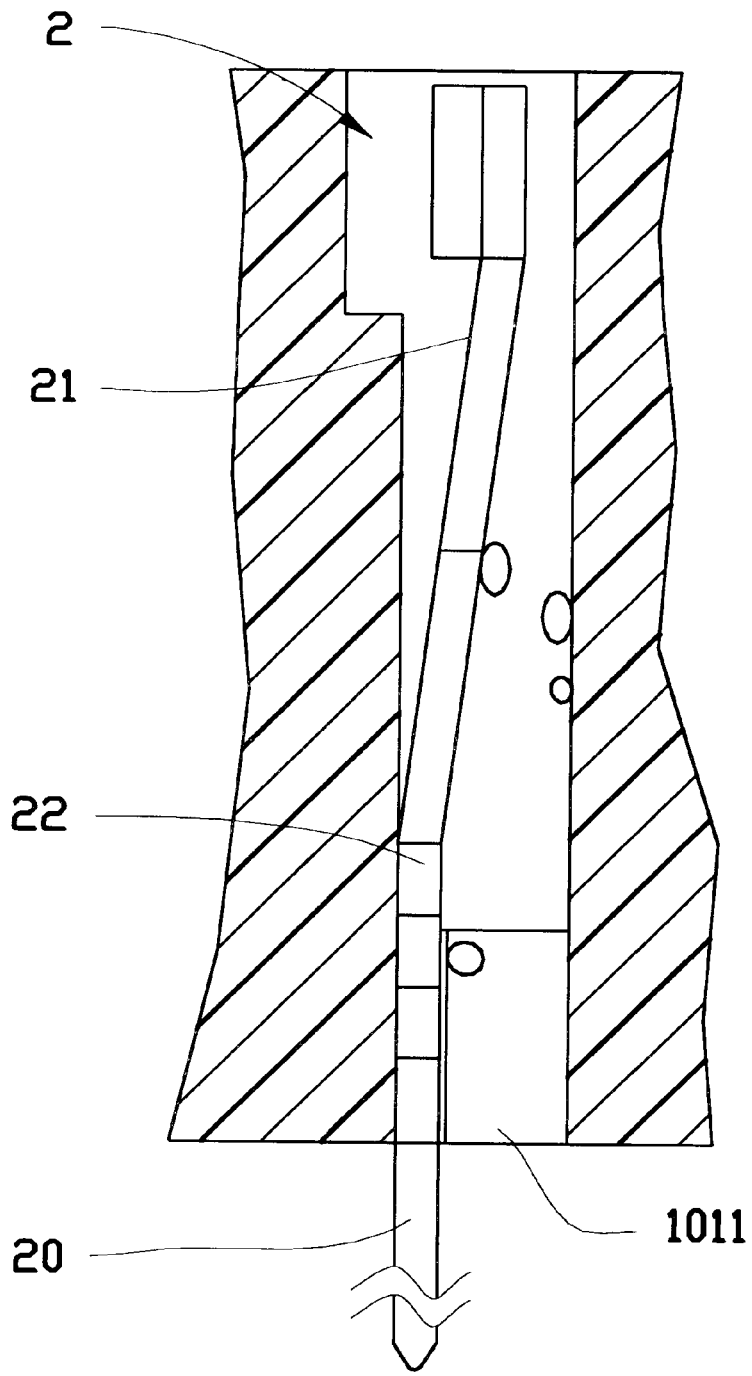
FIG. 1C is a partially cut-away cross-sectional view of a contact assembled in the cavity shown in FIG. 1B.

Reference will now be made in detail to the preferred embodiments of the present invention. It will be noted here that for a better understanding, most of like components are designated by like reference numerals throughout the various figures in the embodiments.

Figure 2:
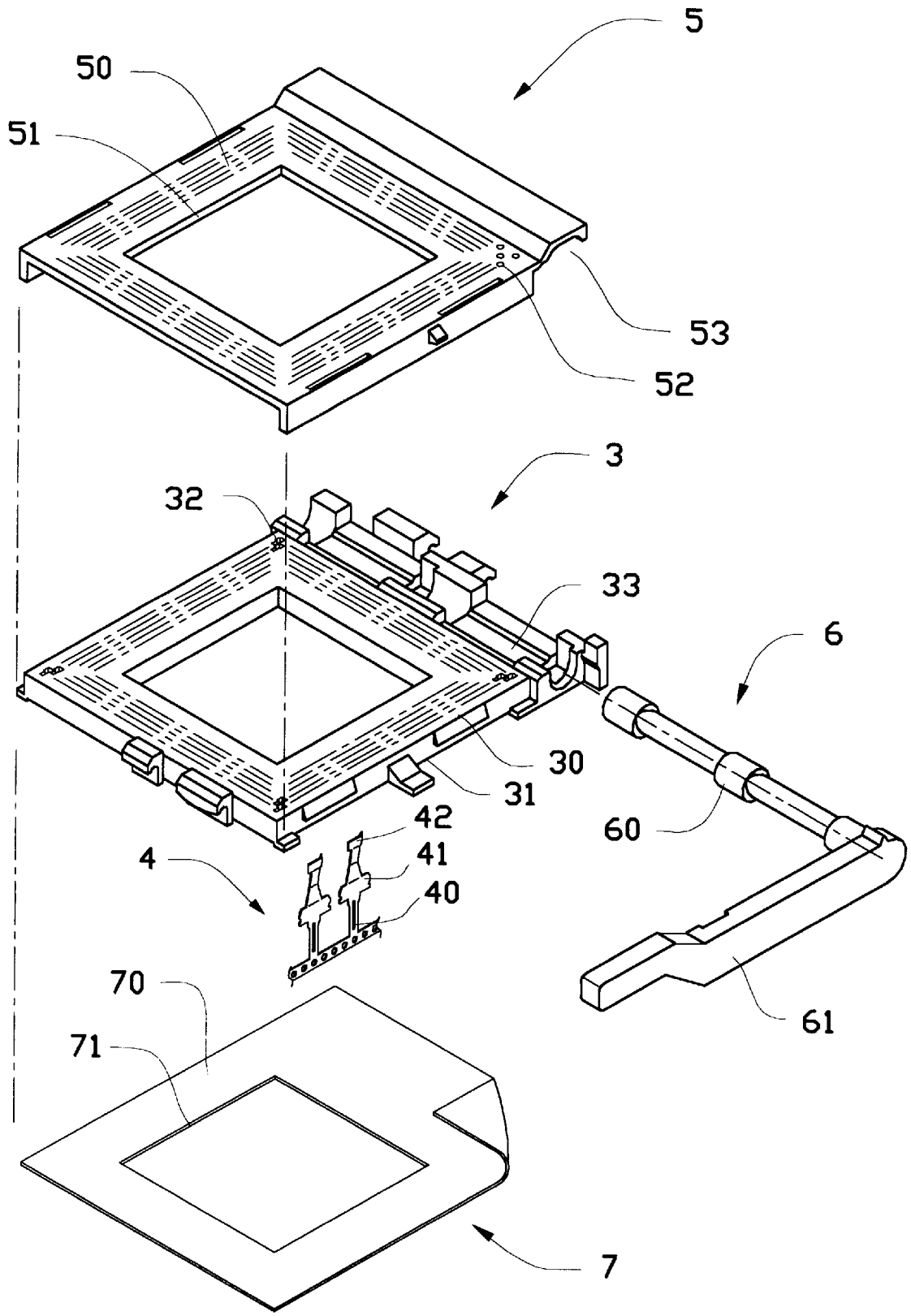
FIG. 2 is an exploded perspective view of a ZIF PGA according to the present invention.
Figure 4:
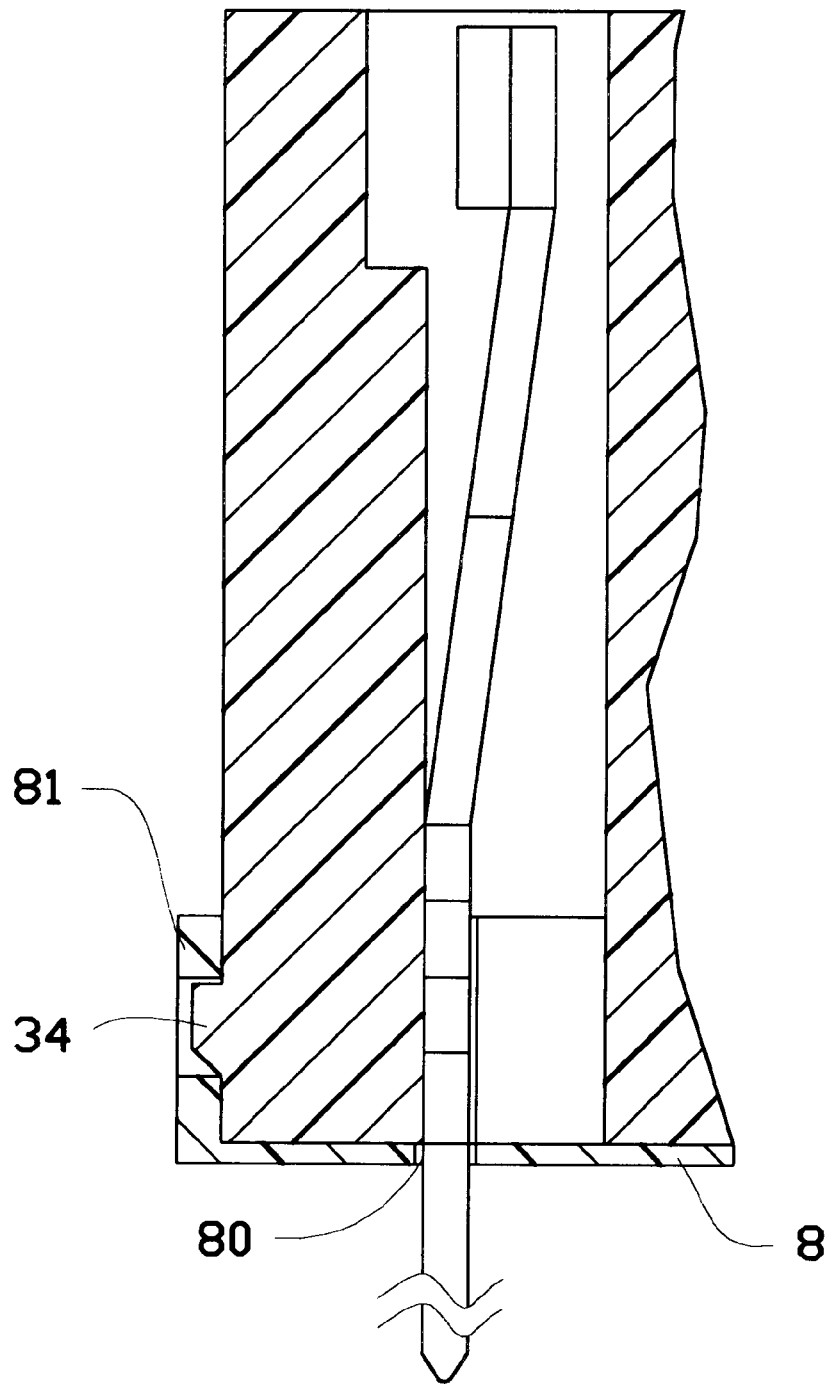
FIG. 4 is a partially cut-away cross-sectional view of a ZIF PGA according to another embodiment the anti-wicking means of the present invention.

Referring now to FIG. 2, a ZIF PGA socket according to the present invention mainly comprises an insulating housing 3, a plurality of conductive contacts 4, an insulating cap 5, an actuating member 6, and anti-wicking means 7 (or 8 in FIG. 4).

Figure 3:
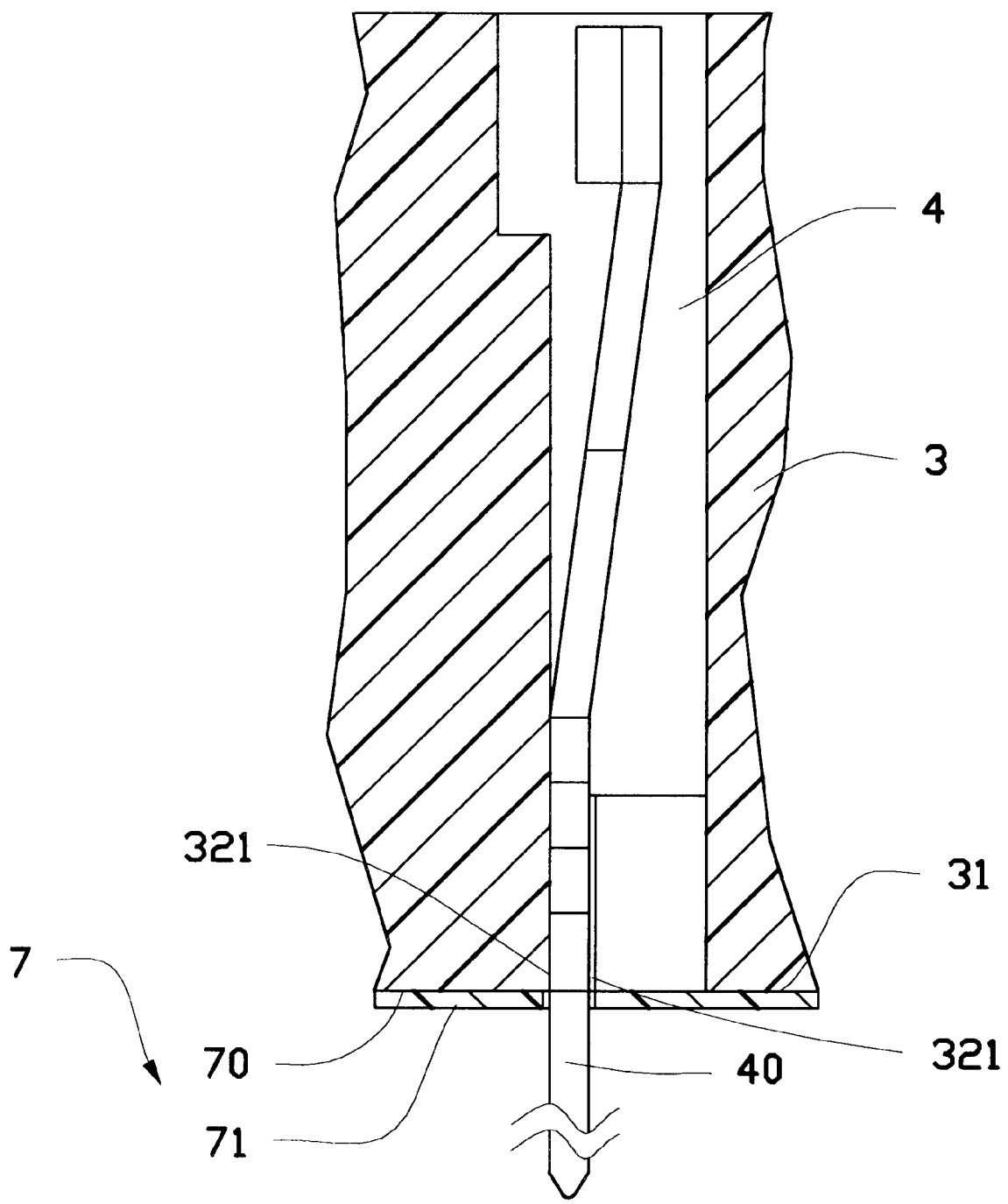
FIG. 3 is a partially cut-away cross-sectional view of a ZIF PGA according to one embodiment of an anti-wicking means of the present invention.

The insulating housing 3 is substantially a square housing defining an upper mating surface 30 and a lower soldering surface 31. The insulating housing 3 comprises a plurality of vertical through cavities 32 communicating the mating surface 30 and the soldering surface 31. Each of the vertical through cavities 32 is provided with a vertical through recess 321 (also referring to FIG. 3) for mounting the contacts 4 from a bottom thereof. The insulating housing 3 also comprises guiding means 33 on a lateral portion for rotatably guiding the actuating member 6. In one preferred embodiment, the guiding means 33 includes a plurality of cam guiding grooves 33.

Each of the conductive contacts 4 comprises a soldering section 40 for soldering onto a surface of a printed circuit board, a fixing section 41 for interferingly fitting into an inner wall of the housing 3, and a contacting section 42 for retainably contacting a pin of a mating chip (not shown).

The insulating cap 5 is substantially a square cap defining an upper mating surface 50 and a lower mounting surface 51. The insulating cap 5 comprises a plurality of vertical through holes 52 communicating the mating surface 50 and the soldering surface 51 and corresponding to the plurality of vertical through cavities 32 for receiving a pin of a mating chip (not shown). The insulating cap 5 also comprises positioning means 53 on a lateral portion corresponding to the guiding means 33 of the housing 3 for positioning the actuating member 6. In one preferred embodiment, the positioning means 53 includes a cam positioning groove 53 corresponding to the cam guiding grooves 33 of the housing 3.

The actuating means 6 comprises a cam portion 60 and a handle portion 61 extending from one end of the cam portion 60 and perpendicular thereto.

When assembling the present ZIF PGA, the contacts 4 are inserted into the cavities 32 of the housing 3 from the bottom, the insulating cap 5 is horizontally slidably mounted on the mating surface 30 of the housing 3. The cam portion 60 of the actuating means 6 is provided between the guiding means 33 and the positioning means 53 and the handle 61 is rotatable respective to a shaft of the cam portion 60 to actuating the cap 5 respective to the housing 3 between a first relative position in which pins of a mating chip inserted in the cavities 5 through the holes 3 substantially do not contact the contacts 4 and a second relative position in which each said pins closely contacts the contacting section 42 of the contact 4.

The anti-wicking means is provided on the soldering surface 31 of the housing 3 for prevention of wicking and splashing of the molten solder in waving soldering procedure. In one embodiment, the anti-wicking means includes shielding means 7 comprising an upper attaching portion 70 for attaching to a bottom of the housing 3, and a lower shielding portion 71 for sealing up the bottom of the cavities 32. The attaching portion 70 can be a layer of adhesive, and the shielding portion 71 can be a film of anti-thermal material. The soldering section 40 of the contacts 4 can penetrate the attaching portion 70 and the shielding portion 71 and project out of the housing 3 for wave soldering, leaving all other portions of the housing 3 protected from exposure to the molten solder.

Please now refer to FIG. 4. In this embodiment, the anti-wicking means includes a shielding plate 8 and an attachment means 81 provided thereon. The shielding plate 8 includes a plurality of through holes 80 for extending of the soldering section 40 of the contacts 4 out of the housing 3 and the attachment means 81 can be a pair of locking recesses formed on a pair of upward bending portions (only the left recess and upward bending portion are shown in FIG. 4) of the plate 8 for latching with a pair of lateral protrusions 34 of the housing 3 (only the left protrusion 34 is shown in FIG. 4).

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

We claim:

1. A socket connector for a chip, comprising:

an insulating housing defining a mating surface and a soldering surface, including a plurality of through cavities communicating the mating surface and the soldering surface;

a plurality of conductive contacts received in said through cavities, each including a soldering section for soldering onto a surface of a printed circuit board, a fixing section for fixing to the insulation housing, and a contacting section for contacting a pin of the chip; and anti-wicking means including at least one attaching portion for attaching to the housing and a shielding portion for sealing a bottom of each of the cavities to prevent entrance of contaminants;

wherein said shielding portion includes a shielding plate, and said at least one attaching portion includes a pair of locking recesses formed on a pair of upward bending portions of the shielding plate and a pair of lateral protrusions projecting from the housing and latching into said locking recesses.

2. The socket connector for a chip as claimed in claim 1, wherein said at least one attaching portion includes a layer of adhesive and said shielding portion includes a film of anti-thermal material coated on said adhesive layer.

3. The socket connector for a chip as claimed in claim 2, further comprises an insulating cap provided on the mating surface of the insulating housing, defining a mating surface and a mounting surface confronting the mating surface of the insulating housing, including a plurality of through holes communicating the mating surface and the soldering surface thereof and corresponding to the plurality of through cavities of the insulating housing.

4. The socket connector for a chip as claimed in claim 3, further comprises actuating means for generating relative sliding motion between the mounting surface of said insulating cap to the mating surface of said insulating housing.

5. The socket connector for a chip as claimed in claim 4, wherein said insulating housing further comprises guiding means on a lateral portion thereof and said insulating cap further comprises positioning means on a lateral portion thereof corresponding to said guiding means, and said actuating means comprises a cam portion provided between said guiding means and said positioning means and a handle portion extending from one end of said cam portion for rotating said cam portion.

6. The socket connector for a chip as claimed in claim 1, further comprises an insulating cap provided on the mating surface of the insulating housing, defining a mating surface and a mounting surface confronting the mating surface of the insulating housing, including a plurality of through holes communicating the mating surface and the soldering surface thereof and corresponding to the plurality of through cavities of the insulating housing.

7. The socket connector for a chip as claimed in claim 6, further comprises actuating means for generating relative sliding motion between the mounting surface of said insulating cap to the mating surface of said insulating housing.

8. The socket connector for a chip as claimed in claim 7, wherein said insulating housing further comprises guiding means on a lateral portion thereof and said insulating cap further comprises positioning means on a lateral portion thereof corresponding to said guiding means, and said actuating means comprises a cam portion provided between said guiding means and said positioning means and a handle portion extending from one end of said cam portion for rotating said cam portion.

\* \* \* \* \*